United States Patent
Cha et al.

(10) Patent No.: US 9,379,283 B2
(45) Date of Patent: Jun. 28, 2016

(54) METHOD OF MANUFACTURING NANOSTRUCTURE SEMICONDUCTOR LIGHT EMITTING DEVICE BY FORMING NANOCORES INTO OPENINGS

(71) Applicant: SAMSUNG ELECTRONICS CO., LTD., Suwon-si, Gyeonggi-do (KR)

(72) Inventors: Nam Goo Cha, Ansan-si (KR); Geon Wook Yoo, Seongnam-si (KR); Han Kyu Seong, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/165,112

(22) Filed: Jan. 27, 2014

(65) Prior Publication Data

US 2014/0209859 A1    Jul. 31, 2014

(30) Foreign Application Priority Data

Jan. 29, 2013  (KR) ........................ 10-2013-0010110

(51) Int. Cl.
*H01L 33/20*    (2010.01)
*H01L 33/00*    (2010.01)
*H01L 33/18*    (2010.01)
*H01L 33/24*    (2010.01)

(52) U.S. Cl.
CPC .............. *H01L 33/20* (2013.01); *H01L 33/005* (2013.01); *H01L 33/18* (2013.01); *H01L 33/24* (2013.01)

(58) Field of Classification Search
CPC .............. H01L 33/002; H01L 33/0025; H01L 33/0029; H01L 33/0033; H01L 33/0037; H01L 33/0041; H01L 33/0045; H01L 33/005; H01L 33/0054; H01L 33/0058; H01L 33/0062; H01L 33/0066
See application file for complete search history.

(56) References Cited

U.S. PATENT DOCUMENTS 6,861,305 B2    3/2005    Koike et al.
7,427,772 B2    9/2008    Chuo et al.
(Continued)

FOREIGN PATENT DOCUMENTS

JP    2001-284266 A    10/2001
JP    2008-066591 A    3/2008
(Continued)

OTHER PUBLICATIONS

International Search Report issued in Application No. PCT/KR2014/000811 dated May 20, 2014.
(Continued)

*Primary Examiner* — Yu-Hsi D Sun
*Assistant Examiner* — Mikka Liu
(74) *Attorney, Agent, or Firm* — McDermott Will & Emery LLP

(57) ABSTRACT

A method of manufacturing a nanostructure semiconductor light emitting device including providing a base layer formed of a first conductivity type semiconductor. A mask including an etch stop layer is formed on the base layer. A plurality of openings are formed in the mask so as to expose regions of. A plurality of nanocores are formed by growing the first conductivity type semiconductor on the exposed regions of the base layer to fill the plurality of openings. The mask is partially removed by using the etch stop layer to expose side portions of the plurality of nanocores. An active layer and a second conductivity type semiconductor layer are sequentially grown on surfaces of the plurality of nanocores.

14 Claims, 13 Drawing Sheets

(56) References Cited

U.S. PATENT DOCUMENTS

| | | |
|---|---|---|
| 7,462,867 B2 | 12/2008 | Tezen |
| 7,906,787 B2 | 3/2011 | Kang |
| 7,947,989 B2 | 5/2011 | Ha et al. |
| 8,030,664 B2 | 10/2011 | Moon et al. |
| 2006/0223211 A1 | 10/2006 | Mishra et al. |
| 2007/0037365 A1* | 2/2007 | Ranganath ............ B82Y 10/00 438/478 |
| 2007/0041214 A1 | 2/2007 | Ha et al. |
| 2007/0257264 A1* | 11/2007 | Hersee et al. .................. 257/76 |
| 2008/0157057 A1 | 7/2008 | Kim |
| 2008/0246076 A1* | 10/2008 | Chen .................. H01L 21/0337 257/316 |
| 2010/0193813 A1 | 8/2010 | Kao et al. |
| 2011/0114915 A1 | 5/2011 | Lee et al. |
| 2012/0012968 A1 | 1/2012 | Konsek |
| 2012/0061641 A1 | 3/2012 | Seong et al. |
| 2013/0153860 A1* | 6/2013 | Kim .................. H01L 51/0002 257/14 |
| 2013/0341658 A1 | 12/2013 | Lee et al. |
| 2014/0048902 A1 | 2/2014 | Raj et al. |
| 2014/0097401 A1 | 4/2014 | Robin |
| 2014/0166974 A1* | 6/2014 | Yoo et al. ........................ 257/13 |

FOREIGN PATENT DOCUMENTS

| | | |
|---|---|---|
| KR | 10-2007-0100852 A | 10/2007 |
| KR | 2008-0035578 A | 4/2008 |
| KR | 10-0959290 B1 | 5/2010 |
| KR | 10-2011-0054318 A | 5/2011 |
| KR | 2012-0028104 A | 3/2012 |
| KR | 10-1148758 B1 | 5/2012 |
| KR | 2012-0058137 A | 6/2012 |
| KR | 10-2014-0000818 A | 1/2014 |

OTHER PUBLICATIONS

Korean Office Action issued in corresponding Korean Application No. 10-2013-0164523 dated Feb. 10, 2015.

K. Tomioka et al., "GaAs/AlGaAs Core Multishell Nanowire-Based Light-Emitting Diodes on Si," Nano Letters 2010, 10, 1639-1644; American Chemical Society.

S. Li et al., "GaN based nanorods for solid state lighting," Journal of Applied Physics 111, 071101 (2012).

U.S. Office Action issued in U.S. Appl. No. 14/764,349.

* cited by examiner

METHOD OF MANUFACTURING NANOSTRUCTURE SEMICONDUCTOR LIGHT EMITTING DEVICE BY FORMING NANOCORES INTO OPENINGS

CROSS-REFERENCE TO RELATED APPLICATION

This application claims benefit of priority from Korean Patent Application No. 10-2013-0010110, filed on Jan. 29, 2013 in the Korean Intellectual Property Office, the entire contents of which are hereby incorporated by reference.

TECHNICAL FIELD

The present inventive concept relates to a nanostructure semiconductor light emitting device and a method of manufacturing the nanostructure semiconductor light emitting device.

BACKGROUND

A semiconductor light emitting device such as a light emitting diode (LED) is a device capable of generating light from materials included therein, through the conversion of energy generated by the recombination of electrons and holes into light. LEDs have been widely used in illumination devices, display devices and light sources, and the development thereof has therefore tended to be accelerated.

In recent times, in order to enhance crystalline properties and light efficiency through an increase in a light emitting region, semiconductor light emitting devices using nanostructures, and manufacturing technologies therefor, have been proposed. Semiconductor light devices using nanostructures generate a relatively small amount of heat. Further, since a nanostructure used therein may have an increased surface area, the light emitting area may be increased to thus improve light emission efficiency.

In addition, since an active layer may be obtained in a non-polar surface or a semi-polar surface, a deterioration in light emission efficiency due to polarization can be prevented, and droop characteristics can be improved.

In general, a formation process of a nanostructure requires a process in which a nano-sized crystal is grown in a vertical direction. In this case, in order to increase a light emission area, a nanostructure may need to have a relatively high aspect ratio.

However, such nanostructures may be problematic in that they may be easily broken during a growth process or in a subsequent process thereafter, as well as requiring a sufficient interval between nanostructures so as to maintain separation therebetween.

SUMMARY

An aspect of an embodiment of the present inventive concept provides a manufacturing method for a simplified nanostructure semiconductor light emitting device in which a nanostructure can be stably formed.

An aspect of the present inventive concept relates to a method of manufacturing a nanostructure semiconductor light emitting device. According to the method, a base layer formed of a first conductivity type semiconductor is provided. A mask including an etch stop layer is formed on the base layer. A plurality of openings are formed in the mask so as to expose regions of the base layer. A plurality of nanocores are formed by growing the first conductivity type semiconductor on the exposed regions of the base layer to fill the plurality of openings. The mask is partially removed by using the etch stop layer to expose side portions of the plurality of nanocores. An active layer and a second conductivity type semiconductor layer are sequentially grown on surfaces of the plurality of nanocores.

The mask may include a first material layer formed on the base layer and provided as the etch stop layer, and a second material layer formed on the first material layer and having an etching rate lower than an etching rate of the first material layer.

The mask may include first, second and third material layers sequentially formed on the base layer, and the second material layer may be formed of a material different from materials of the first and third material layers and may be provided as the etch stop layer.

The first and third material layers may be formed of an identical material.

An etch stop level through the etch stop layer may be positioned at a depth equal to or below about ⅓ of the overall height of the mask, from an upper surface of the base layer.

An aspect ratio of the openings may be about 5:1 or higher.

The method may further include forming a diffusion preventing film formed of a material different from a material of the mask on respective inner side walls of the plurality of openings, after the forming of the plurality of openings and before the forming of the plurality of nanocores.

The forming of the diffusion preventing film may include forming a material film for the diffusion preventing film on the surface of the mask, and removing portions of the material film, positioned on an upper surface of the mask and the exposed regions of the base layer such that the material film only remains on an inner side wall of the openings.

The method may further include removing the diffusion preventing film from the exposed side portions of the nanocores, before the sequential growth of the active layer and the second conductivity type semiconductor layer.

After the removing of the diffusion preventing film, a portion of the diffusion preventing film positioned below an upper surface level of the etch stop layer may remain.

The method may further include heat treating the plurality of nanocores after the partial removing of the mask and before the sequential growth of the active layer and the second conductivity type semiconductor layer.

The heat treating of the plurality of nanocores may be performed at a temperature ranging from about 800 to about 1200° C.

The method may further include applying a planarizing process to upper surfaces of the plurality of nanocores to be planarized to have an identical level.

At least one group of nanocores among the plurality of nanocores may have at least one of a cross section and an interval therebetween different from at least one of a cross section of and an interval between another group among the plurality of nanocores.

Another aspect of the present inventive concept encompasses a nanostructure semiconductor light emitting device including a base layer, a mask, a plurality of nano light emitting structures, and a diffusion preventing film. The base layer includes a first conductivity type semiconductor. The mask disposed on the base layer and includes a plurality of openings such that regions of the base layer are exposed thereto. A plurality of nano light emitting structures are respectively disposed on the exposed regions of the base layer, and include nanocores that have a first conductivity type semiconductor. The plurality of nano light emitting structures include an active layer and a second conductivity type semiconductor layer sequentially disposed on surfaces of the nanocores. A diffusion preventing film is located between the nanocore and an inner side wall of the openings.

Still another aspect of the present inventive concept relates to a method of manufacturing a nanostructure semiconductor light emitting device. According to the method, a base layer formed of a first conductivity type semiconductor is provided. A mask including an etch stop layer is formed on the base layer. A plurality of openings are formed in the mask so as to expose regions of the base layer. A diffusion preventing film is formed of a material different from a material of the mask on respective inner side walls of the plurality of openings. A plurality of nanocores are formed by growing the first conductivity type semiconductor on the exposed regions of the base layer to fill the plurality of openings. The mask is partially removed by using the etch stop layer to expose side portions of the plurality of nanocores. The mask is partially removed to expose side portions of the plurality of nanocores. An active layer and a second conductivity type semiconductor layer are sequentially grown on surfaces of the plurality of nanocores. A contact electrode layer is formed on a surface of the second conductivity type semiconductor layer.

The forming of the diffusion preventing film may include forming a material film for the diffusion preventing film on the surface of the mask, and removing portions of the material film, positioned on an upper surface of the mask and the exposed regions of the base layer such that the material film only remains on an inner side wall of the openings.

The method may further include removing the diffusion preventing film from the exposed side portions of the nanocores, before the sequential growth of the active layer and the second conductivity type semiconductor layer.

After the removing of the diffusion preventing film, a portion of the diffusion preventing film positioned below an upper surface level of the etch stop layer may remain.

BRIEF DESCRIPTION OF THE DRAWINGS

The above and other aspects, features and other advantages of the present inventive concept will be more clearly understood from the following detailed description taken in conjunction with the accompanying drawings, which like reference characters may refer to the same or similar parts throughout the different views. The drawings are not necessarily to scale, emphasis instead being placed upon illustrating the principles of the embodiments of the present inventive concept. In the drawings, the thickness of layers and regions may be exaggerated for clarity.

DETAILED DESCRIPTION

Embodiments of the present inventive concept will now be described in detail with reference to the accompanying drawings.

Embodiments of the present inventive concept may, however, be embodied in many different forms and should not be construed as being limited to embodiments set forth herein. Rather, these embodiments of the present inventive concept are provided so that this disclosure will be thorough and complete, and will fully convey the scope of the present inventive concept to those skilled in the art.

FIGS. 1A to 1E are cross-sectional views illustrating respective main processes of a method of manufacturing a nanostructure semiconductor light emitting device according to an embodiment of the present inventive concept.

The method of manufacturing a nanostructure semiconductor light emitting device according to an embodiment of the present inventive concept may include initially providing a base layer 12 configured of a first conductivity type semiconductor.

Figure 1A:
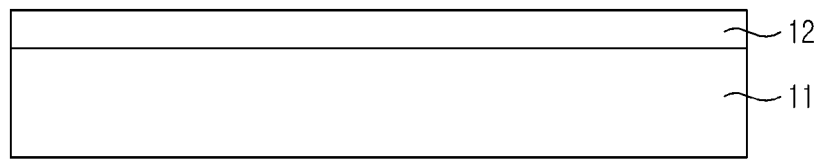
FIGS. 1A to 1E are cross-sectional views illustrating respective main processes of a method of manufacturing a nanostructure semiconductor light emitting device according to an embodiment of the present inventive concept.

As shown in FIG. 1A, the base layer 12 may be provided by growing a first conductivity type semiconductor on a substrate 11.

The base layer 12 may electrically connect respective sides of nano light emitting structures 15, which have respective polarities, while providing a crystal growth surface on which the nano light emitting structures 15 are grown. Therefore, the base layer 12 may be formed of a semiconductor single crystal having electrical conductivity. When the base layer 12 is directly grown, the substrate 11 may be a substrate for crystal growth.

An insulating substrate, a conductive substrate or a semiconductor substrate may be used as the substrate 11. The base layer 12 may be a nitride semiconductor. For example, the substrate 11 may be formed of sapphire, SiC, Si, $MgAl_2O_4$, MgO, $LiAlO_2$, $LiGaO_2$, or GaN. The base layer 12 may be a crystal satisfying $Al_xIn_yGa_{1-x-y}N$ ($0 \le x \le 1$, $0 \le y \le 1$, $0 \le x+y \le 1$).

When a nitride semiconductor single crystal is grown using the base layer 12, the substrate 11 may be a GaN substrate formed of the same material as a material of the base layer. Alternatively, the substrate 11 may be a sapphire substrate, a silicon carbide (SiC) substrate, or the like, as a hetero-type substrate formed of a material different from the material of the base layer. A buffer layer (not separately shown) may be disposed between the substrate 11 and the base layer 12 as needed, to relieve a difference in lattice mismatches. The buffer layer (not separately shown) may be a layer of $Al_xIn_yGa_{1-x-y}N$ ($0 \le x \le 1$, $0 \le y \le 1$), or specifically, may be a GaN, AlN, AlGaN, InGaN or InGaNAlN layer. In addition, the buffer layer may be used by combining a plurality of layers or gradually changing a composition.

When the substrate is formed of silicon, the substrate may be warped or broken due to a difference in coefficients of thermal expansion between Gan and silicon, or the possibility of the occurrence of defects may be increased due to a constant difference. Therefore, in this case, since defects need to be suppressed while providing stress control to suppress warping, a buffer layer having a composite structure may simultaneously be used. For example, first, on the substrate 11, a crystal, such as AlN or SiC, which do not include Ga, may be used in order to prevent a reaction between Si and Ga. When a plurality of AlN layers are used, an AlGaN intermediate layer may be inserted therebetween to control stress therein.

The substrate 11 may be completely or partially removed or patterned during a chip manufacturing process to improve light emission or electrical characteristics of an LED chip, before or after the growth of an LED structure.

For example, in the case of a sapphire substrate, laser rays may be irradiated onto an interface with the substrate and the base layer 12 through the substrate 11 to thus separate the substrate therefrom, and a silicon or silicon carbide substrate may be removed through a grinding method, an etching method, or the like.

When the substrate is removed, another support substrate may be used. Such a support substrate may include a reflective metal attached thereto or a reflective structure may be inserted in the center of a junction layer, in order to improve LED chip light extraction efficiency.

When the substrate is patterned, concave-convex portions or an inclined surface may be formed on main surfaces (including both side surfaces) of the substrate before or after the growth of a single crystal to thus improve light extraction efficiency and crystalline properties. The size of a pattern may be selected from a range of about 5 nm to about 500 μm and any pattern structure capable of increasing light extraction efficiency using a regular or irregular pattern can be used. The pattern may be variously formed, for example, may have a pillar form, a peak-valley form, a semispherical form, or the like.

Figure 1B:
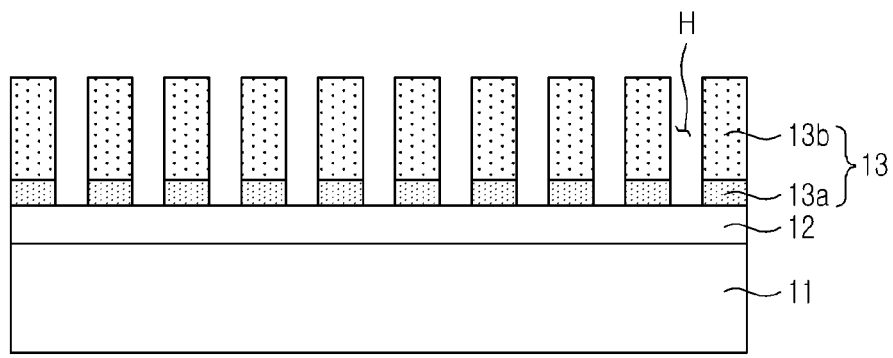

Subsequently, as shown in FIG. 1B, a mask 13 having a plurality of openings H and an etch stop layer provided therein may be formed on the base layer 12.

The mask 13 according to an embodiment of the present inventive concept may include a first material layer 13a formed on the base layer 12, and a second material layer 13b formed on the first material layer 13a and having an etching rate greater than an etching rate of the first material layer 13a.

The first material layer 13a may serve as the etch stop layer. That is, the first material layer 13a may have an etching rate lower than the etching rate of the second material layer 13b in an identical etching condition.

At least the first material layer 13a may be formed of a material having electrical insulation properties, and the second material layer 13b may also be formed of an insulating material as needed. The first and second material layers 13a and 13b may be formed of different materials to obtain a difference in etching rates. For example, the first material layer 13a may be a SiN layer and the second material layer 13b may be an $SiO_2$ layer. Alternatively, such a difference in etching rates may be implemented using pore density. In this case, the first and second material layers 13a and 13b may be formed of the same material having different pore densities.

The total thickness of the first and second material layers 13a and 13b may be determined in consideration of a height of a necessary nanostructure. The first material layer 13a may have a thickness less than a thickness of the second material layer 13b. An etch stop level through the first material layer 13a may be positioned at a depth equal to about ⅓ of the overall height of the mask 13, or below. That is, at a position at a depth equal to about ⅓ of the total thickness of the first and second material layers 13a and 13b, or below, from the surface of the base layer 12.

The overall height of the mask 13, that is, the total thickness of the first and second material layers 13a and 13b may be about 1 μm or higher, and specifically, may range from about 5 to about 10 μm. The first material layer 13a may have a thickness of about 0.5 μm.

After the first and second material layers 13a and 13b are sequentially formed on the base layer 12, a plurality of openings H may be formed in the first and second materials layers to expose regions of the base layer 12 through the openings H (see FIG. 1B). The size of each opening H may be determined in consideration of a size of the nano light emitting structure. For example, the opening H may have a width of about 500 nm or less, specifically, about 200 nm.

The opening H may be formed through a semiconductor process, for example, a deep-etching process to have a relatively high aspect ratio. The opening H may be implemented to have an aspect ratio of about 5:1 or higher, specifically, about 10:1 or higher.

Figure 2A:
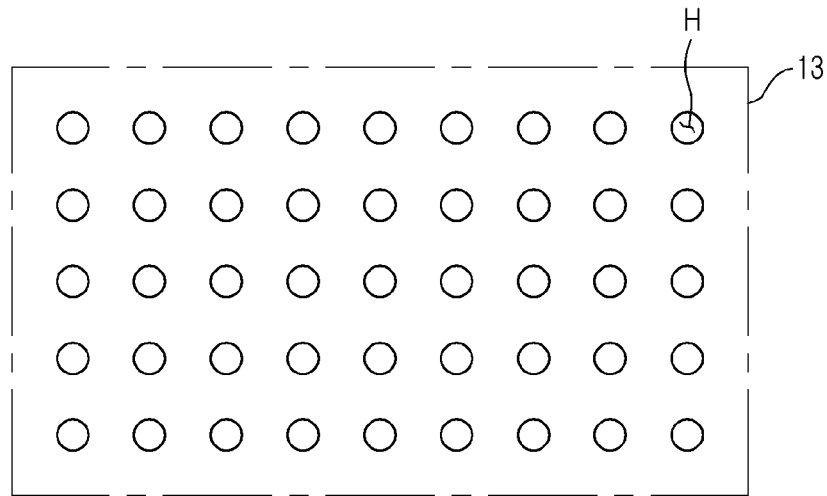
FIGS. 2A and 2B are plan views of masks illustrating shapes of openings as viewed from above, formed in the mask, according to embodiments of the inventive concept.
Figure 2B:
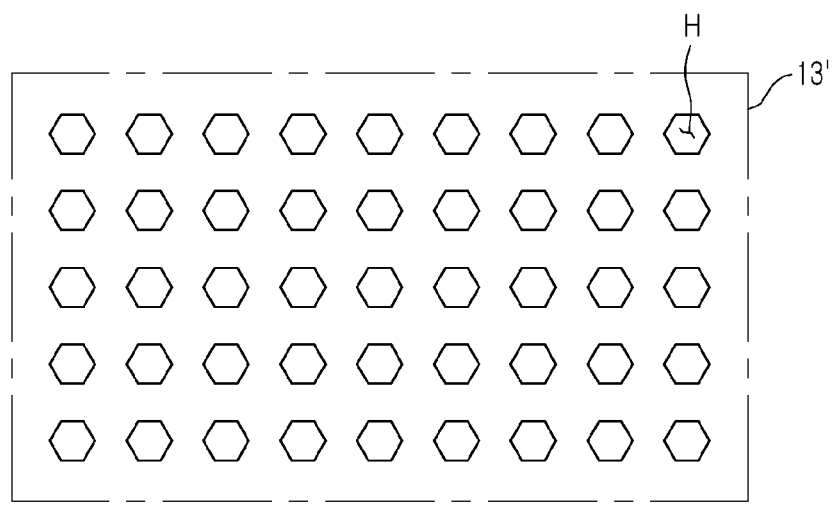

Shapes of the openings H and the alignment thereof may be variously implemented. For example, in the case of a planar shape, the opening H may have various shapes as viewed from above, such as a polygonal shape, a quadrangular shape, an elliptical shape or a circular shape. The mask 13 shown in FIG. 1B may have the openings H having a circular top-viewed shape aligned therein, as illustrated in FIG. 2A, but may have different shapes and alignments. For example, as illustrated in a mask 13' of FIG. 2B, openings having a regular hexagonal top-viewed shape may be aligned.

Figure 3A:
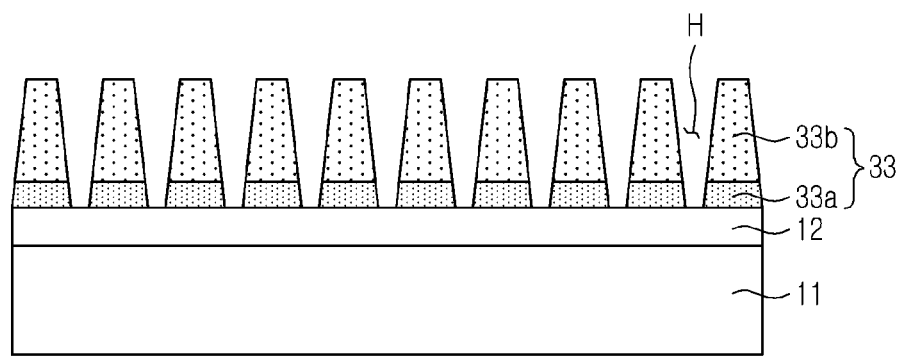
FIGS. 3A and 3B are side cross-sectional views illustrating openings formed in the mask according to embodiments of the inventive concept.
Figure 3B:
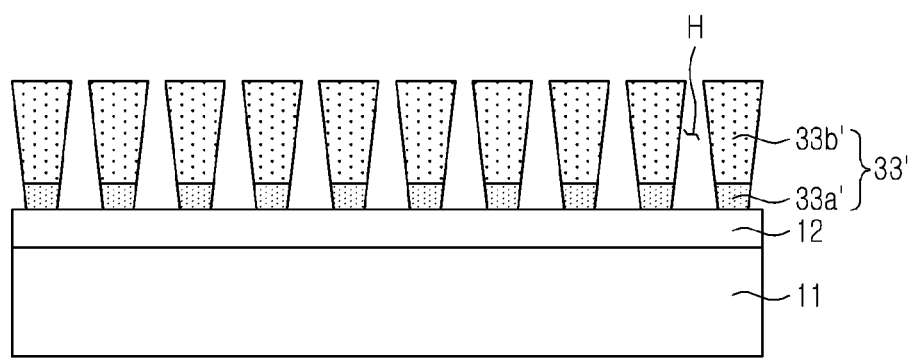

Although FIG. 1B illustrates the case in which the opening H shown in has a rod form, the present inventive concept should not be limited thereto. The opening H may be variously shaped due to using an appropriate etching process. As such examples, FIGS. 3A and 3B illustrate different shaped openings formed in the mask. In FIG. 3A, a mask 33 configured of first and second material layers 33a and 33b has an opening H having a pillar form of which the cross sections are gradually reduced in area toward to an upper part thereof. In FIG. 3B, a mask 33' configured of first and second material layers 33a' and 33b' may have openings H having a pillar form of which the cross sections have gradually reduced areas toward to an upper part thereof.

Figure 1C:
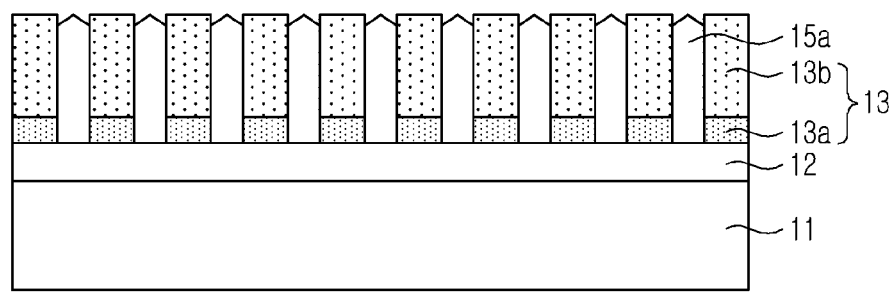

Subsequently, as shown in FIG. 1C, a first conductivity type semiconductor is grown on the exposed regions of the base layer 12 such that the plurality of openings H are provided with the first conductivity type semiconductor, thereby forming a plurality of nanocores 15a.

The first conductivity type semiconductor of the nanocores 15a may be an n-type nitride semiconductor, for example, may be a crystal satisfying n-type $Al_xIn_yGa_{1-x-y}N$ ($0 \leq x \leq 1$, $0 \leq y \leq 1$, $0 \leq x+y \leq 1$). The first conductivity type semiconductor of the nanocores may be formed of the same material as the first conductivity type semiconductor of the base layer 12. For example, the base layer 12 and the nanocores 15a may be formed of n-type GaN.

The nanocores 15a may include a nitride single crystal of the nanocores 15a. The nitride single crystal may be formed using metal organic chemical vapor deposition (MOCVD) or molecular beam epitaxy (MBE). The mask 13 may serve as a mold for a grown nitride single crystal to provide nanocores 15a having a shape corresponding to a shape of the opening.

That is, the nitride single crystal may be selectively grown on regions of the base layer 12 exposed to the openings H by using the mask 13 to fill the openings H. The nitride single crystal selectively grown on regions of the base layer 12 exposed to the openings H may have a shape corresponding to a shape of the corresponding openings H.

Figure 1D:
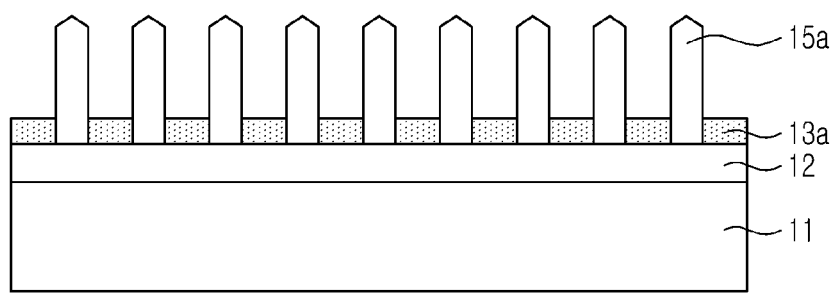

Next, as shown in FIG. 1D, the mask 13 may be partially removed using the etch stop layer such that side portions of the plurality of nanocores 15a are exposed.

In an embodiment of the present inventive concept, an etching process for selectively removing the second material layer 13b may be applied to thus only remove the second material layer 13b with the first material layer 13a remaining. In an etching process according to the present inventive concept, the first material layer 13a may be used as an etch stop layer, and in a subsequent process, the first material layer 13a may serve to prevent an active layer 15b and a second conductivity type semiconductor layer 15c from contacting the base layer 12.

Figure 1E:
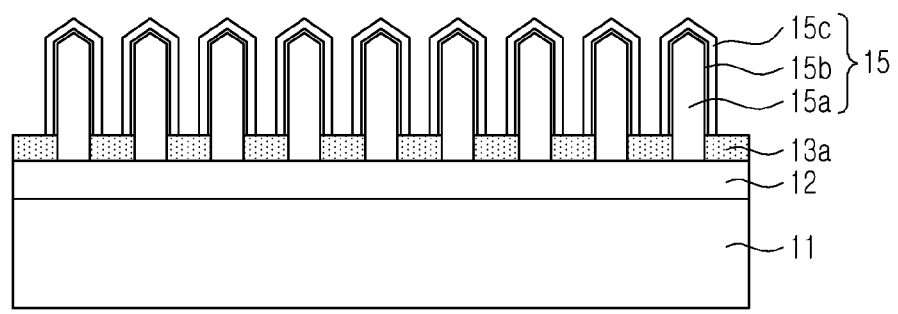

Then, as illustrated in FIG. 1E, the active layer 15b and the second conductivity type semiconductor layer 15c may be sequentially grown on the surfaces of the plurality of nanocores 15a.

Through the processes described above, the nano light emitting structure 15 may have a core-shell structure in which the first conductivity type semiconductor is provided as the nanocores 15a, and the active layer 15b and the second conductivity type semiconductor layer 15c surrounding the nanocore 15a are provided as shell layers.

The active layer 15b may have a multiple quantum well (MQW) structure in which quantum well layers and quantum barrier layers are alternately stacked on top of each other, and for example, may have a GaN/InGaN structure in the case of a nitride semiconductor. Here, a single quantum well (SQW) structure may also be used.

The second conductivity type semiconductor layer 15c may be a crystal satisfying p-type $Al_xIn_yGa_{1-x-y}N$. The second conductivity type semiconductor layer 15c may further include an electron stopping layer (not separately shown) on a portion thereof adjacent to the active layer 15b. The electron stopping layer (not separately shown) may have a structure in which a plurality of different compositional n-type $Al_xIn_yGa_{1-x-y}N$ layers are stacked or may have at least one or more layers configured of $Al_yGa_{(1-y)}N$. The electron stopping layer (not separately shown) may have a bandgap greater than a bandgap of the active layer 15b to thus prevent electrons from flowing to the second conductive (e.g., p-type) semiconductor layer 15c.

As such, although an embodiment of the present inventive concept illustrates the case in which the nano light emitting structure 15 has a core-shell structure and a rod form, the present inventive concept should not be limited thereto. That is, the nano light emitting structure 15 may be variously formed, for example, may have a pyramid form or a form in which pyramid and rod forms are combined.

In a process of manufacturing a nano light emitting structure by using a mask having openings formed therein as a mold, an additional heat treatment to improve crystalline properties may be introduced.

After removing the mask, a nanocore surface may be subjected to a heat treatment in a predetermined condition such that a nanocore crystal plane may be changed to a stabilized plane suitable for crystal growth, such as a semipolar or non-polar crystal plane. Such a process may be explained with reference to FIGS. 4A and 4B.

Figure 4A:
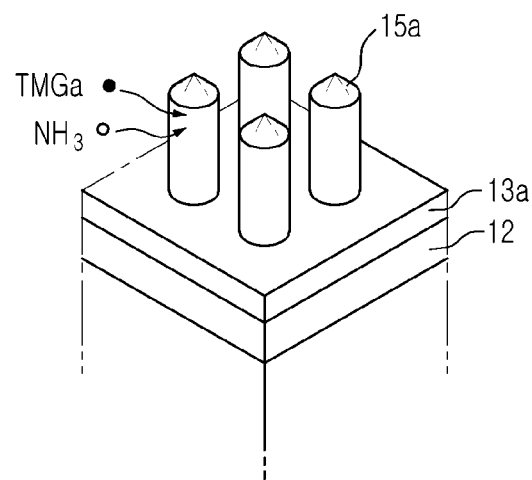
FIGS. 4A and 4B illustrate a heat treatment process applied to the process illustrated in FIG. 1D.
Figure 4B:
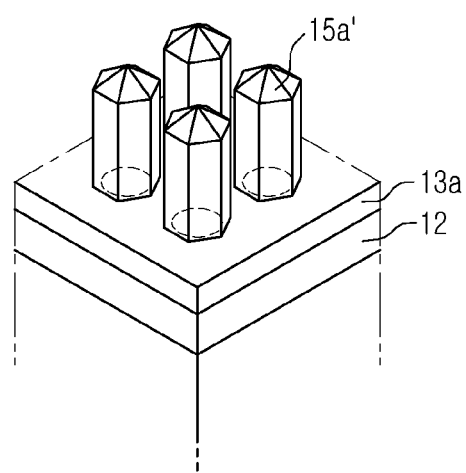

FIGS. 4A and 4B illustrate a heat treatment process applied to the process illustrated in FIG. 1D.

FIG. 4A illustrates nanocores 15a that can may be obtained in the process of FIG. 1D. The nanocore may have a crystal plane determined by a shape of an opening as viewed from above. Although the nanocore has a different crystal plane depending on a shape of the opening as viewed from above, a nanocore surface provided as described above may have a relatively unstable crystal plane, which may be a factor deteriorating a subsequent crystal growth condition.

As in an embodiment of the present inventive concept, when the opening has a cylindrical rod form, a side of the nanocore may have a curved surface other than a specific crystal plane.

When this nanocore is subjected to a heat treatment, unstable crystals on the surface thereof may be re-aligned to then have a stabilized crystal plane such as in semi-polarity or non-polarity as illustrated in FIG. 4B. The heat treatment may be performed under a condition of at least about 800° C. for several to tens of minutes, thereby realizing conversion of an unstable crystal plane into a stabilized crystal plane.

For example, when the sapphire substrate having a c-plane (0001) is grown, the nanocores 15a shown in FIG. 4A may be subjected to a heat treatment at a temperature of about 800° C. or above such that an unstable crystal plane is converted into a nonpolar surface (an m plane). A process of stabilizing such a crystal plane may be implemented through a high-temperature heat treatment process. When crystals positioned on the surface at a relatively high temperature are re-aligned or a source gas remains in a chamber, it can be understood that partial re-growth is performed through deposition of the remaining source gas to have a stabilized crystal plane.

In particular, in the case of re-growth, a heat treatment process may be performed in an atmosphere in which source gas remains in a chamber, or a heat treatment may be performed in a condition of additionally supplying a relatively small amount of source gas. For example, as shown in FIG. 4A, in the case of an Metalorganic Chemical Vapour Deposition (MOCVD) chamber, TMGa and $NH_3$ remain, and in this residual atmosphere, the heat treatment may be performed such that source gas reacts with the nanocore surface to thus realize partial re-growth so as to have a stabilized crystal plane. During the re-growth, the size of nanocore (e.g., nanocores 15a' in FIG. 4B) may be slightly increased as shown in FIG. 4B.

As such, the heat treatment may be performed in the MOCVD in a condition similar to a core formation condition after removing the mask to improve a surface quality of a nanostructure. That is, by such a heat treatment process, non-uniformity (for example, a defect or the like) on a surface of a core manufactured after removing the mask may be eliminated, and a shape of the core may be controlled to have a stabilized structure, for example, a hexagonal pillar form. A temperature of the heat treatment process as described above may be a temperature similar to a temperature in a core growth condition, for example, about 800 to about 1200° C.

The nanostructure semiconductor light emitting device shown in FIG. 1E may include an electrode formed in various manners.

FIGS. 5A to 5E are cross-sectional views illustrating examples of main processes of forming an electrode.

Figure 5A:
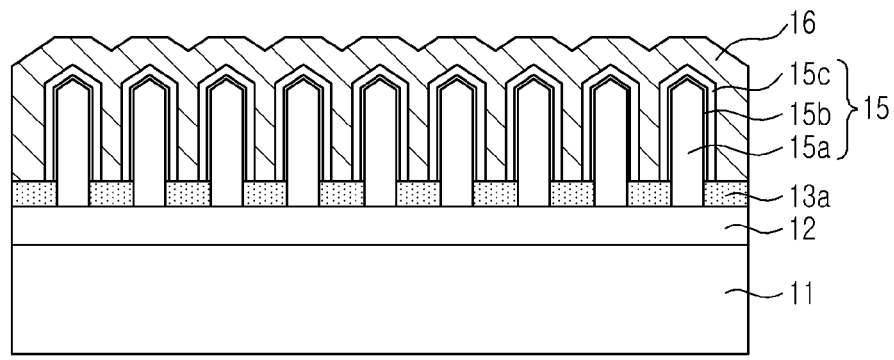
FIGS. 5A to 5E are cross-sectional views illustrating examples of main processes of forming an electrode applied to a nanostructure semiconductor light emitting device provided in a process of FIG. 1E.

First, as shown in FIG. 5A, a contact electrode layer 16 may be formed on the nano light emitting structure 15 provided in the process of FIG. 1E.

The contact electrode layer 16 may be obtained by forming a seed layer on the surface of the nano light emitting structure 15 and then performing electroplating thereon. This seed layer may be formed of a material suitable for ohmic contact with the second conductivity type semiconductor layer. As a material for the ohmic contact, GaN, InGaN, ZnO, or graphene may be used. The contact electrode layer 16 may include a material such as Ag, Ni, Al, Rh, Pd, Ir, Ru, Mg, Zn, Pt, Au, or the like and may have a structure of two or more layers, for example, a layer structure of Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like. For example, after sputtering an Ag/Ni/Cr layer as a seed layer, the contact electrode layer 16 may be formed by electroplating Cu/Ni.

The contact electrode layer 16 used in an embodiment of the present inventive concept may be formed using a reflective metal layer, from which light can be extracted toward the substrate, but the present inventive concept should not be limited thereto. The contact electrode layer 16 may be formed employing a transparent material such as indium tin oxide (ITO) such that light may be extracted from the nano light emitting structure 15.

In another embodiment of the present inventive concept, when the surface having the contact electrode layer 16 formed thereon is not uniform, the electrode upper surface may be planarized using a planarizing process, such as a CMP (chemical mechanical polishing).

Figure 5B:
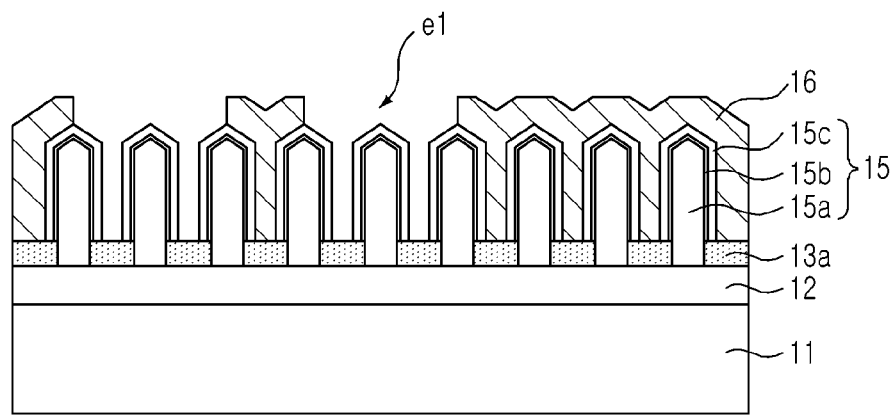

Then, as shown in FIG. 5B, the nano light emitting structure 15 may be exposed by selectively removing an electrode region e1 in a region in which an electrode having another polarity is to be formed. Next, as shown in FIG. 5C, a portion e2 of the base layer may be exposed by selectively removing the portion of the nano light emitting structure 15 exposed by the removing process of FIG. 5B.

Figure 5C:
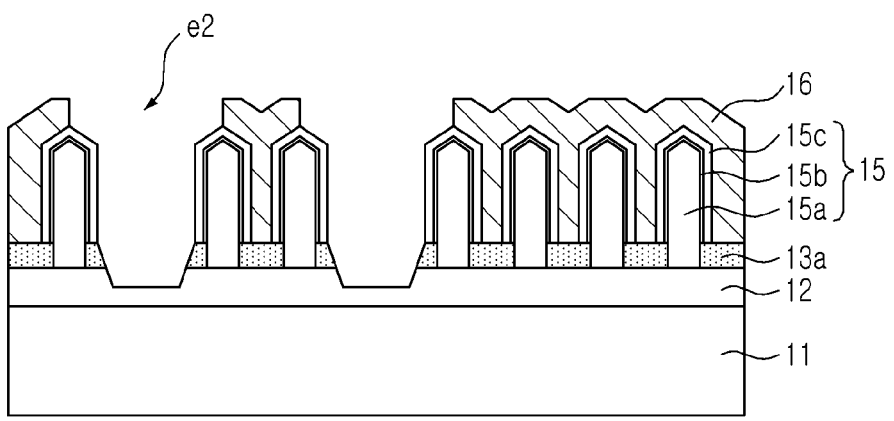

The process illustrated in FIG. 5B is a process of etching an electrode material such as a metal, and the process illustrated in FIG. 5C is a process of etching a semiconductor material. These etching processes may be performed under conditions different from each other.

Figure 5D:
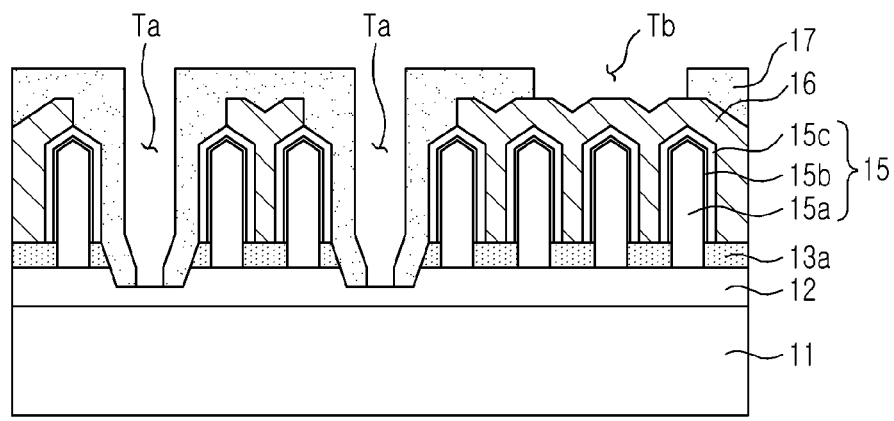

Subsequently, as shown in FIG. 5D, an insulating film 17 may be formed such that contact regions Ta and Tb for electrodes are exposed. The contact region Ta for a first electrode may be provided as an exposure region of the base layer 12, and the contact region Tb for a second electrode may be provided as a partial region of the contact electrode layer 16.

Figure 5E:
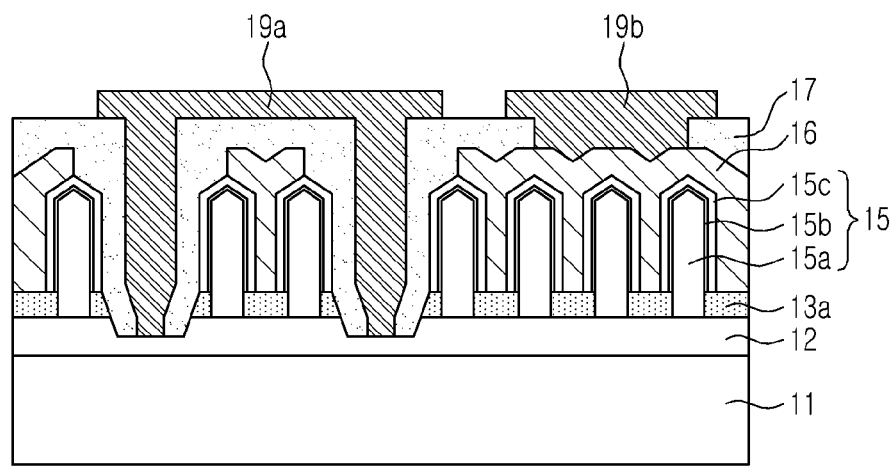

Thereafter, as shown in FIG. 5E, first and second electrodes 19a and 19b may be formed to be connected to the contact regions Ta and Tb, respectively. A common electrode material may be used for forming the first and second electrodes 19a and 19b in a process according to an embodiment of the present inventive concept. For example, a material for the first and second electrodes 19a and 19b may be Au, Ag, Al, Ti, W, Cu, Sn, Ni, Pt, Cr, NiSn, TiW, AuSn, or eutectic metals thereof.

In the above-mentioned embodiment of the present inventive concept, the mask (e.g., 13 in FIG. 1B) is configured of two material layers (e.g., 13a and 13b), but the present inventive concept should not be limited thereto. That is, three or more material layers may be employed.

FIGS. 6A to 6D are cross-sectional views illustrating respective main processes of a method of manufacturing a nanostructure semiconductor light emitting device according to another embodiment (with a change in a mask structure) of the present inventive concept.

Figure 6A:
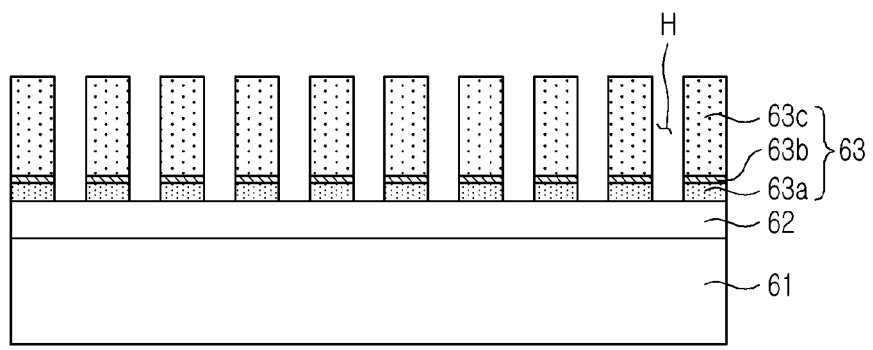
FIGS. 6A to 6D are cross-sectional views illustrating respective main processes of a method of manufacturing a nanostructure semiconductor light emitting device according to another embodiment (with a change in a mask structure) of the present inventive concept.

As illustrated in FIG. 6A, a base layer 62 may be provided on a substrate 61, and on the base layer 62, a mask 63 having a plurality of openings H formed therein and an etch stop layer 63b interposed therein may be formed.

The mask 63 employed in an embodiment of the present inventive concept may include first to third material layers 63a, 63b and 63c sequentially formed on the base layer 62. The second material layer 63b may be provided as the etch stop layer and may be formed of a material different from materials of the first and third material layers 63a and 63c. The first and third material layers 63a and 63c may be formed of the same material.

Under the same etching conditions, since at least the second material layer 63b has an etching rate lower than an etching rate of the third material layer 63c, the second material layer 63b may serve as an etch stop layer. At least the first material layer 63a may be formed of a material having an electrical insulation property. The second or third material layer 63b or 63c may be formed of an insulating material.

The first to third material layers 63a, 63b and 63c may be formed of different materials from one another to obtain a difference in etching rates. For example, the second material layer 63b may be a layer of SiN, and the first and third material layers 63a and 63c may be layers of $SiO_2$. Alternatively, such a difference in etching rates may be realized using a pore density. In this case, the second and third material layers 63b and 63c may be formed of the same material but the materials of the second and third material layers 63b and 63c may have different pore densities.

A total thickness of the first to third material layers 63a, 63b and 63c may be determined in consideration of a height of a nano light emitting structure. The first and second material layers 63a and 63b may have a thickness less than a thickness of the third material layer 63c. An etch stop level through the second material layer 63b may be positioned at a depth equal to about ⅓ of the overall height of the mask 63, or below, that is, at a position at a depth equal to about ⅓ of the total thickness of the first to third material layers 63a, 63b and 63c, or below, from the surface of the base layer 62.

The overall height of the mask 63, that is, the total thickness of the first to third material layers 63a, 63b and 63c may be 1 μm or higher, specifically, may range from 5 to 10 μm. The first and second material layers 63a and 63b may have a thickness of 0.5 μm or less.

The first to third material layers 63a, 63b and 63c may be sequentially formed on the base layer 62, and a plurality of openings H may then be formed therein to expose regions of the base layer 62, with reference to FIG. 6A. The size of respective openings H may be determined in consideration of a size of a nano light emitting structure. For example, the opening may have a width of about 500 nm or less, specifically, about 200 nm.

The opening H may be formed using a semiconductor process. For example, the opening H having a relatively high aspect ratio by using a deep etching process may be formed. An aspect ratio of the opening H may be implemented to be about 5:1 or higher, specifically, about 10:1 or higher.

Figure 6B:
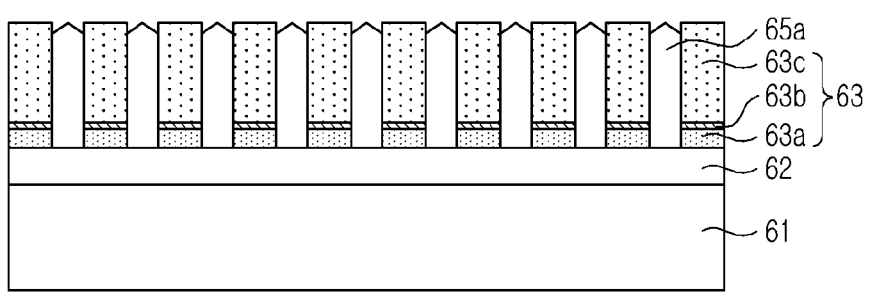

Subsequently, as shown in FIG. 6B, a first conductivity type semiconductor may be grown on the exposed regions of the base layer 12 such that the plurality of openings H are provided with the first conductivity type semiconductor, thereby forming a plurality of nanocores 65a.

The first conductivity type semiconductor of the nanocores 65a may be an n-type nitride semiconductor, for example, may be a crystal satisfying n-type $Al_xIn_yGa_{1-x-y}N$ ($0 \leq x \leq 1$, $0 \leq y \leq 1$, $0 \leq x+y \leq 1$). The first conductivity type semiconductor of the nanocores 65a may be formed of the same material as the first conductivity type semiconductor of the base layer 62. For example, the base layer 62 and the nanocores 65a may be formed of n-type GaN.

The nanocores 65a may include a nitride single crystal formed using an MOCVD process or an MBE process. The mask 63 may serve as a mold for a grown nitride single crystal to provide nanocores 65a having a shape corresponding to a shape of the opening. That is, the nitride single crystal may be selectively grown on regions of the base layer 62 exposed to the openings H by using the mask 63 to fill the openings H. The nitride single crystal selectively grown on regions of the base layer 62 exposed to the openings H may have a shape corresponding to a shape of the corresponding openings H.

Figure 6C:
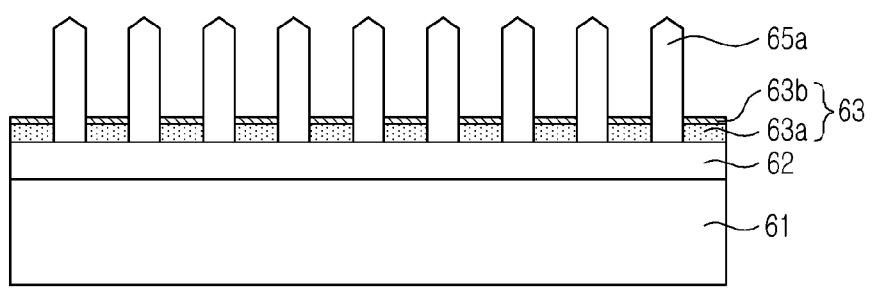

Next, as shown in FIG. 6C, the mask 63 may be partially removed using the second material layer 63b as an etch stop layer, such that side portions of the plurality of nanocores 65a are exposed.

In an embodiment of the present inventive concept, the etching process may be applied in conditions for selectively removing the third material layer 63c to thus only remove the third material layer 63c and allow the first and second material layers 63a and 63b to remain. In an etching process according to an embodiment of the present inventive concept, the second material layer 63b may be used as an etch stop layer, and in a subsequent process, the second material layer 63b, together with the first material layer 63a, may serve to prevent an active layer 65b and a second conductivity type semiconductor layer 65c from contacting the base layer 62.

When necessary, the heat treatment process described with reference to FIGS. 4A and 4B may be applied such that the surfaces of the nanocores 65a may have relatively more stabilized crystal planes like non-polar surface or semi-polar surface, thereby improving a subsequently grown crystal quality.

Figure 6D:
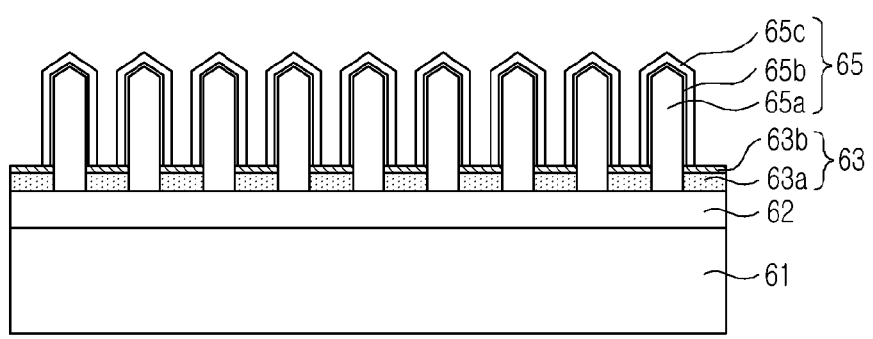

Then, as illustrated in FIG. 6D, the active layer 65b and the second conductivity type semiconductor layer 65c may be sequentially grown on the surfaces of the plurality of nanocores 65a.

Through the processes described above, the nano light emitting structure 65 may have a core-shell structure in which the first conductivity type semiconductor is provided as the nanocores 65a, and the active layer 65b and the second conductivity type semiconductor layer 65c surrounding the nanocore 65a are provided as shell layers.

The active layer 65b may have a multiple quantum well (MQW) structure in which quantum well layers and quantum barrier layers are alternately stacked on top of each other, for example, may have an GaN/InGaN structure in the case of a nitride semiconductor. Here, a single quantum well (SQW) structure may also be used.

The second conductivity type semiconductor layer 65c may be a crystal satisfying p-type $Al_xIn_yGa_{1-x-y}N$. The second conductivity type semiconductor layer 65c may further include an electron stopping layer (not separately shown) on a portion thereof adjacent to the active layer 65b. The electron stopping layer (not separately shown) may have a structure in which a plurality of different compositional n-type $Al_xIn_yGa_{1-x-y}N$ layers are stacked. Alternatively, the electron stopping layer may have at least one or more layers configured of $Al_yGa_{(1-y)}N$. The electron stopping layer may have a bandgap greater than a bandgap of the active layer 65b to thus prevent electrons from flowing to the second conductive (e.g., p-type) semiconductor layer 65c.

As such, although an embodiment of the present inventive concept illustrates the case in which the nano light emitting structure 65 has a core-shell structure and a rod form by way of example, the present inventive concept should not be limited thereto. That is, the nano light emitting structure 65 may be variously formed, for example, may have a pyramid form or a form in which pyramid and rod forms are combined.

In an embodiment of the present inventive concept, since the mask is used as a mold for the growth of the nanocores, the mask may directly contact the surfaces of nanocores to be subsequently grown. In this case, since the semiconductor growth process for nanocores is performed at a relatively high temperature, a component of the mask may be diffused toward the nanocores to cause a deterioration in crystalline properties thereof. In order to prevent such defects, a scheme in which a diffusion preventing film may be employed on side walls of openings of the mask will be additionally described herein.

FIGS. 7A to 7G are cross-sectional views illustrating respective main processes of a method of manufacturing a nanostructure semiconductor light emitting device according to another embodiment (with the use of a diffusion preventing film) of the present inventive concept.

Figure 7A:
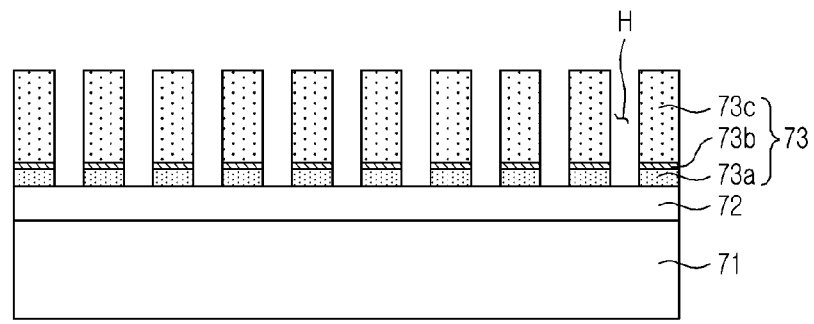
FIGS. 7A to 7G are cross-sectional views illustrating respective main processes of a method of manufacturing a nanostructure semiconductor light emitting device according to another embodiment (with the use of a diffusion preventing film) of the present inventive concept.

As illustrated in FIG. 7A, a base layer 72 may be provided on a substrate 71, and on the base layer 72, a mask 73 having a plurality of openings H formed therein and an etch stop layer 73b interposed therein may be formed.

The mask 73 employed in an embodiment of the present inventive concept may have a similar structure to the mask 63 described in the afore-mentioned embodiment as illustrated in FIGS. 6A-6D. That is, the mask may include first to third material layers 73a, 73b and 73c sequentially formed on the base layer 72. The second material layer 73b may be provided as the etch stop layer and may be formed of a material different from materials of the first and third material layers 73a and 73c. The first and third material layers 73a and 73c may be formed of the same material.

Under the same etching conditions, since at least the second material layer 73b has an etching rate lower than an etching rate of the third material layer 73c, the second material layer 73b may serve as an etch stop layer. At least the first material layer 73a may be formed of a material having an electrical insulation property. The second or third material layer 73b or 73c may be formed of an insulating material.

The first to third material layers 73a, 73b and 73c may be formed of different materials from one another to obtain a difference in etching rates. Alternatively, such a difference in etching rates may be realized using pore density. In this case, the second and third material layers 73b and 73c may be formed of the same material but the material may have different pore densities.

Figure 7B:
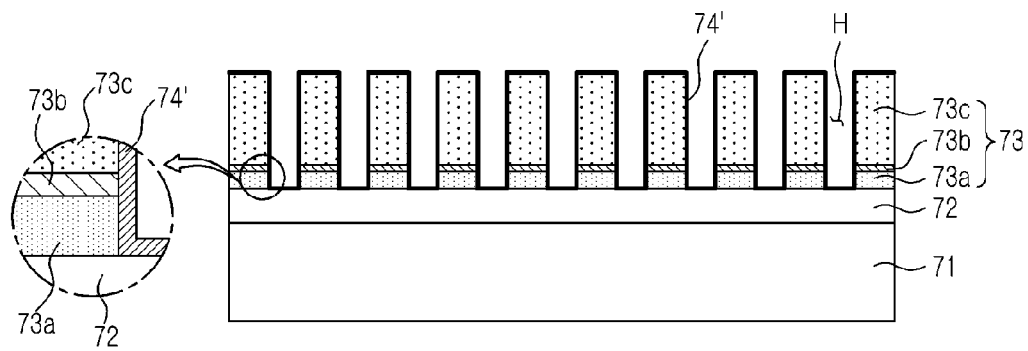
Figure 7C:
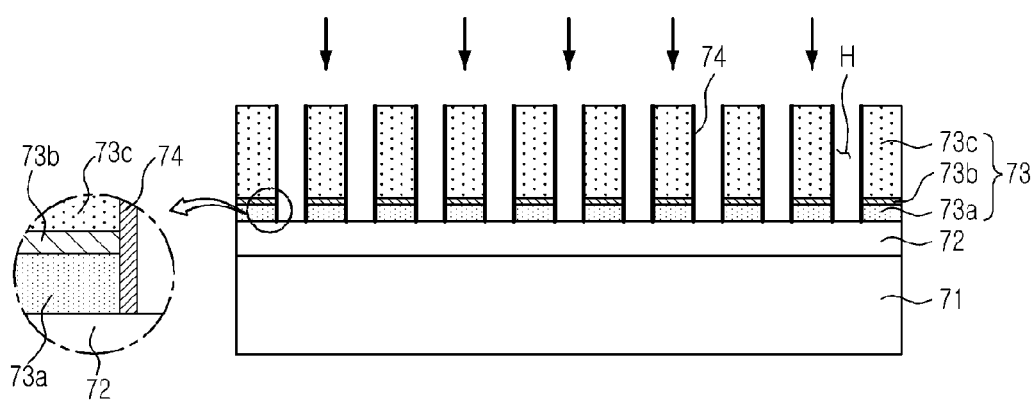

Next, FIGS. 7B and 7C illustrate a process of forming a diffusion preventing film on a side wall of the opening by way of example. First, as shown in FIG. 7B, a material film 74' for the diffusion preventing film may be formed on the surface of the mask 73.

The material film 74' used as the diffusion preventing film may be formed of a material having higher thermal stability than a material used for the mask 73, specifically, the third material layer 73c. For example, as this material film, TiN, TaN or a combination thereof may be used. Since such material film 74' has excellent thermal stability as compared with a general mask such as a $SiO_2$ mask, the material film 74' may be used as a diffusion preventing film.

Then, as shown in FIG. 7C, portions of the material film 74', positioned on an upper surface of the mask 73 and exposed regions of the base layer 72 may be removed such that the material film 74' only remains on an inner side wall of the opening, thereby obtaining a diffusion preventing film 74 disposed on a required region.

A portion in which the diffusion preventing film is disposed may be limited to a side wall of the opening directly contacting a nanocore 75a and the mask 73, and the diffusion preventing film 74 having a form as illustrated in FIG. 7C may be used. Specifically, when the diffusion preventing film remains on the exposed regions of the base layer 72, since subsequent crystal growth may not be performed, the portions of diffusion preventing film 74 positioned on the exposed portions of the base layer 72 may be eliminated.

Referring to FIG. 7C, since the side wall of the opening H is approximately vertically formed, such a selective removal process may be performed in a manner of only removing a material film positioned on the upper surface of the mask 73 and the exposed regions of the base layer 72 through an anisotropic etching such as a dry etching.

Figure 7D:
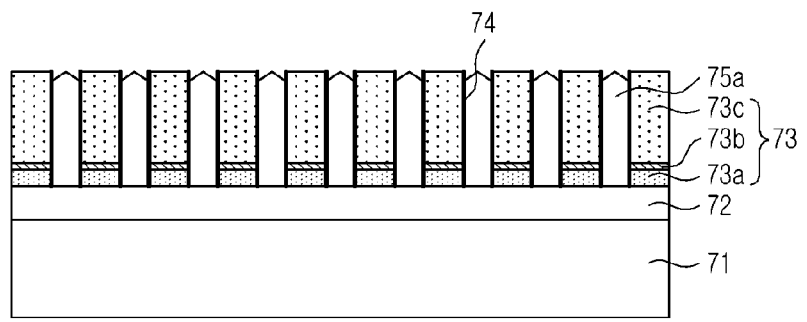

As shown in FIG. 7D, then, the plurality of nanocores 75a may be formed by allowing a first conductivity type semiconductor to be grown on the exposed regions of the base layer 72 to fill the plurality of openings H.

The first conductivity type semiconductor of the nanocores 75a may be an n-type nitride semiconductor, for example, may be a crystal satisfying n-type $Al_xIn_yGa_{1-x-y}N$ ($0 \leq x \leq 1$, $0 \leq y \leq 1$, $0 \leq x+y \leq 1$). The first conductivity type semiconductor of the nanocores 75a may be formed of the same material as the first conductivity type semiconductor of the base layer 72. For example, the base layer 72 and the nanocores 75a may be formed of n-type GaN.

The nanocores 75a may include a nitride single crystal formed through the MOCVD process or the MBE process. The mask 73 may serve as a mold for the grown nitride single crystal to provide nanocores 75a having a shape corresponding to a shape of the opening. That is, the nitride single crystal may be selectively grown on regions of the base layer 72 exposed to the openings H by using the mask 73 to fill the openings H. The nitride single crystal grown on regions of the base layer 72 exposed to the openings H may have a shape corresponding to a shape of the corresponding openings H.

Figure 7E:
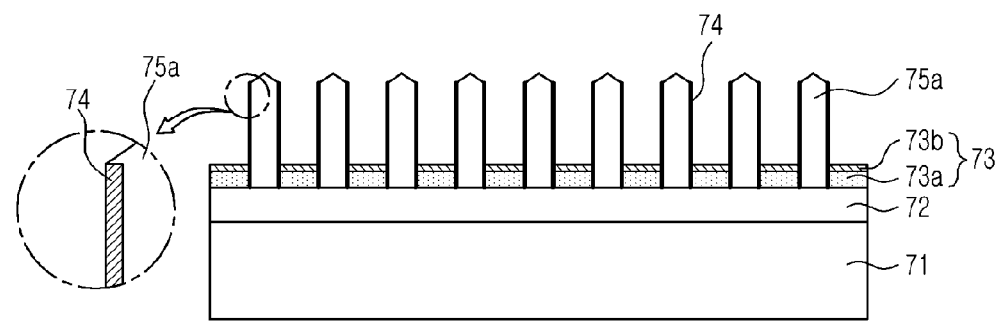

Next, as shown in FIG. 7E, the mask 73 may be partially removed using the second material layer 73b as the etch stop layer, such that side portions of the plurality of nanocores 75a are exposed.

In an embodiment of the present inventive concept, an etching process in a condition that the third material layer 73c is selectively removed may be applied to only remove the third material layer 73c and allow the first and second material layers 73a and 73b to remain.

Figure 7F:
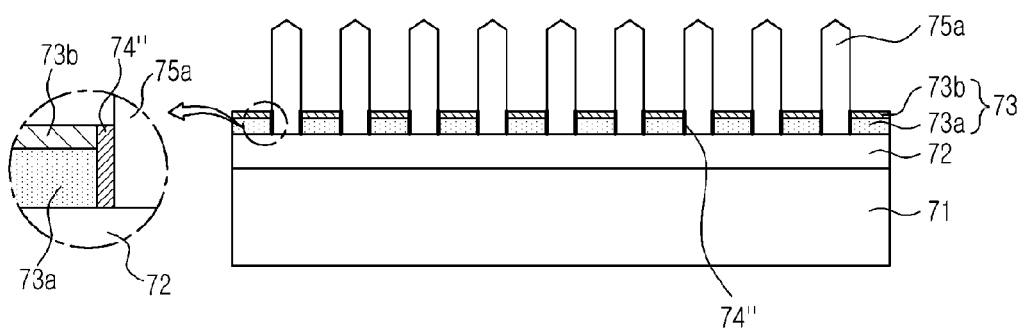

Then, as illustrated in FIG. 7F, the diffusion preventing film 74 may be removed from the exposed surface of the nanocore 75a.

Since the diffusion preventing film 74 is formed of a relatively stabilized material, the diffusion preventing film 74 may not be removed in the preceding etching process of removing the third material layer 73a, but may remain on the surface of the nanocore 75a. As such, when the diffusion preventing film 74 remains, a subsequent crystal growth process may not be performed. Thus, in this case, it may be necessary to perform the process of removing the diffusion preventing film 74 to expose a crystal plane of the nanocore 75a.

The diffusion preventing film 74 may be removed through a separate etching process of removing a material forming the diffusion preventing film 74. Even when such a removal process is applied, a residual mask, that is, the first and second material layers, and non-removed portions of the diffusion preventing film between the nanocores 75a may not be removed, that is, may remain. Since these portions may not be used as crystal growth surfaces, bad influences do not act on the nanostructure semiconductor light emitting device.

The heat treatment process described with reference to FIGS. 4A and 4B may be applied such that the surfaces of the nanocores 75a may have relatively more stabilized crystal planes like non-polar surfaces or semi-polar surfaces, thereby improving a subsequently grown crystal quality.

Figure 7G:
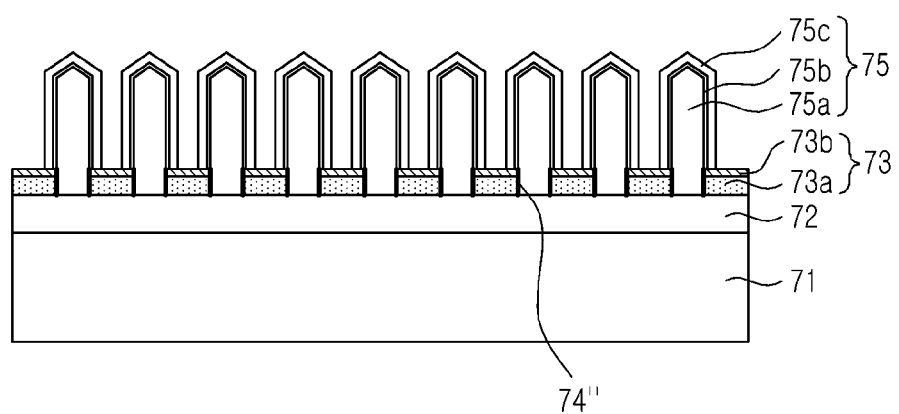

Next, as illustrated in FIG. 7G, the active layer 75b and the second conductivity type semiconductor layer 75c may be sequentially grown on the surfaces of the plurality of nanocores 75a.

Through the processes described above, the nano light emitting structure 75 may have a core-shell structure in which the first conductivity type semiconductor is provided as the nanocores 75a, and the active layer 75b and the second conductivity type semiconductor layer 75c surrounding the nanocore 75a are provided as shell layers.

The active layer 75b may have a multiple quantum well (MQW) structure in which quantum well layers and quantum barrier layers are alternately stacked on top of each other, for example, may have an GaN/InGaN structure in the case of a nitride semiconductor. Here, a single quantum well (SQW) structure may also be used.

The second conductivity type semiconductor layer 75c may be a crystal satisfying p-type $Al_xIn_yGa_{1-x-y}N$. The second conductivity type semiconductor layer 75c may further include an electron stopping layer (not separately shown) on a portion thereof adjacent to the active layer 75b.

Figure 8:
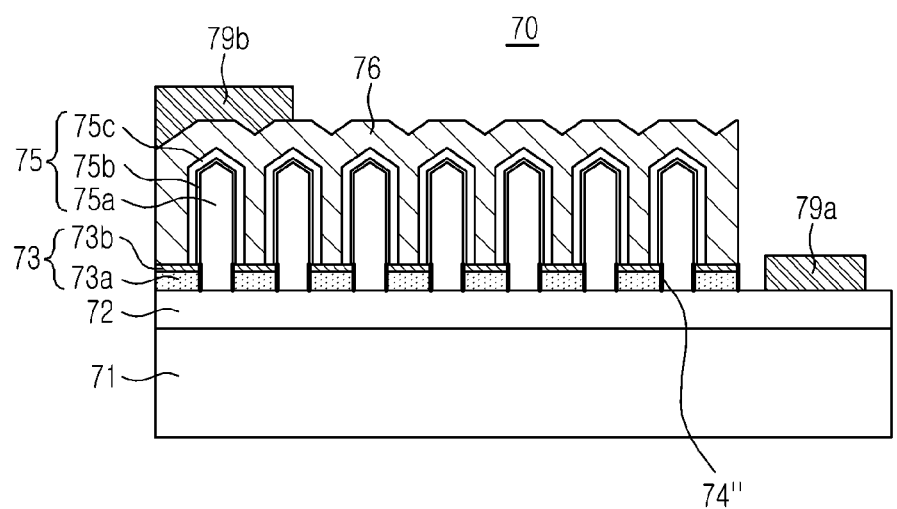
FIG. 8 is a cross-sectional view illustrating an example of a final structure in a nanostructure semiconductor light emitting device provided in FIG. 7G.

As described above, the nanostructure semiconductor light emitting device may include an electrode formed in various manners. FIG. 8 illustrates an example of a nanostructure semiconductor light emitting device employing another electrode structure, an example of a final structure of the nanostructure semiconductor light emitting device obtained with reference to FIG. 7G.

As shown in FIG. 8, the nanostructure semiconductor light emitting device 70 may include a plurality of nano light emitting structures 75 formed over the substrate 71.

The base layer 72 may be formed on the substrate 71, and the base layer 72 may provide a growth surface for the nano light emitting structure 75 and may be formed of a first conductivity type semiconductor.

The mask 73 having openings for the growth of the nano light emitting structure, specifically, the nanocore, may be formed on the base layer 72. The mask 73 may include the second and third material layers formed of an insulating material such as $SiO_2$ or $SiN_x$.

The nano light emitting structure 75 may include nanocores 75a formed of a first conductivity type semiconductor, an active layer 75b and a second conductivity type semiconductor layer 75c sequentially formed on the surfaces of the nanocores 75a.

Specifically, in an embodiment of the present inventive concept, the nano light emitting structure 75 may include a residual diffusion preventing film 74" between the nanocore 75c and an inner side wall of the opening H as illustrated in FIGS. 7F, 7G and 8. As such, a portion of the diffusion preventing film below an upper surface level of the etch stop layer may remain. The residual diffusion preventing film 74" may be formed of a material having relatively excellent thermal stability as compared with a mask configuring material. As the material of the residual diffusion preventing film 74", TiN, TaN or a combination thereof may be used.

Referring to FIG. 8, the nanostructure semiconductor light emitting device 70 according to an embodiment of the present inventive concept may include a contact electrode layer 76 in the form of filling the nano light emitting structures 75. This electrode layer 76 may structurally stabilize the nano light emitting structure 75 while forming the second conductivity type semiconductor layer and an ohmic contact layer. The nano structure semiconductor light emitting device 70 may include first and second electrodes 79a and 79b respectively connected to the base layer 72 configured of the first conductivity type semiconductor and the contact electrode layer 76.

The above-described embodiments provide the various examples of a method of manufacturing a nanostructure semiconductor light emitting device, for growing a nanocore by using a mask having openings, as a mold.

In another embodiment of the present inventive concept, when nanocores are grown using a mold structure, upper ends of the nanocores may have different forms or the plurality of nanocores may be grown to have different heights, thus causing an uneven or rough structure, and in order to prevent a non-uniform distribution of nanocores from inducing a bad influence upon the semiconductor light emitting device, a planarizing process may be further included after forming the plurality of nanocores, such that upper surfaces of the plurality of nanocores may be planarized to have an identical level.

As such, in the process of planarizing the nanocores to have the same level, at least one group of nanocores among the plurality of nanocores may have at least one of cross sections of and intervals between the at least one group of nanocores different from at least one of cross sections of and intervals between remaining nanocores.

By differentiating any one of the cross sections of the light emitting structures and intervals therebetween, even when the same active layer formation process is applied thereto, two or more different wavelengths of light may be emitted. As described above, two or more different wavelengths of light may be emitted by differentiating the cross sections of and intervals between nanostructures, thereby obtaining white light from a single device in a final process. FIGS. 9A to 9d are cross-sectional views illustrating respective main processes of a method of manufacturing a nanostructure semiconductor light emitting device according to another embodiment (with the use of a planarizing process) of the present inventive concept.

Figure 9A:
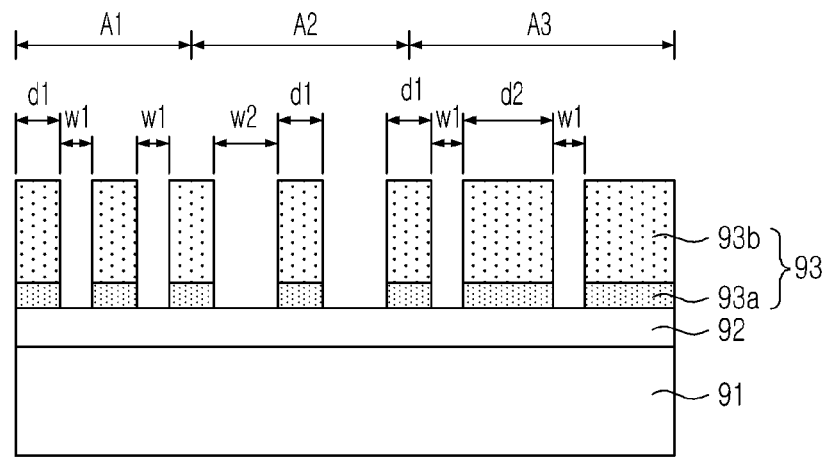
FIGS. 9A to 9D are cross-sectional views illustrating respective main processes of a method of manufacturing a nanostructure semiconductor light emitting device according to another embodiment (with the introduction of a planarizing process) of the present inventive concept.

First, as shown in FIG. 9A, a mask 93 having a plurality of openings H and an etch stop layer interposed therein may be formed on a base layer 92 formed on a substrate 91.

The mask 93 according to an embodiment of the present inventive concept may include a first material layer 93a formed on the base layer 92, and a second material layer 93b formed on the first material layer 93a and having an etching rate greater than an etching rate of the first material layer 93a.

The openings H may have different forms. In detail, in an embodiment of the present inventive concept, three different groups may be formed. Openings A2 of a second group have the same interval d1 therebetween as an interval d2 between openings A1 of a first group, and may have a width w2 greater than a width w1 of the opening A1 of the first group. An opening A3 of a third group may have the same width w3 as the width w1 of the opening A1 of the first group, and the openings A3 of the third group may have an interval d3 therebetween greater than an interval d1 between the openings A1 of the first group.

Substantially, the increase in an interval between the openings indicates a relative increase in a contact amount of source gas with regard to the same area, and thus, a growth speed of nanocores 95a may be relatively rapid. The increase in a width of the opening indicates a relative reduction in the contact amount of source gas in the same area, and thus, the growth speed of the nanocores 95a may be relatively slow.

Figure 9B:
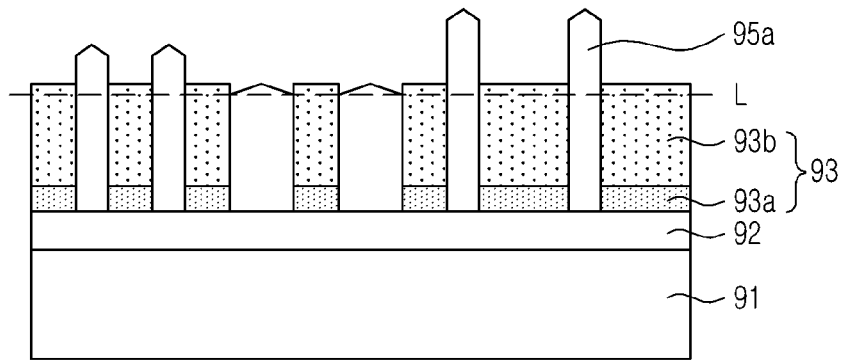

As described above, the nanocores 95a may have different heights for respective groups, for example, three groups, due to the difference in a growth speed of the nanocores 95a between the width of the opening and the interval between the openings as shown in FIG. 9B. In order to improve the non-uniform height, planarization to form an appropriate level, e.g, a level L in FIG. 9B, may be performed in the present process as shown in FIG. 9C, thereby achieving a uniform height of the nanocores 95a per respective group.

Since the mask 93 is used as a structure supporting the nanocores 95a in the planarization process as described above, the planarization process may be easily performed without damage to the nanocores 95a.

Figure 9C:
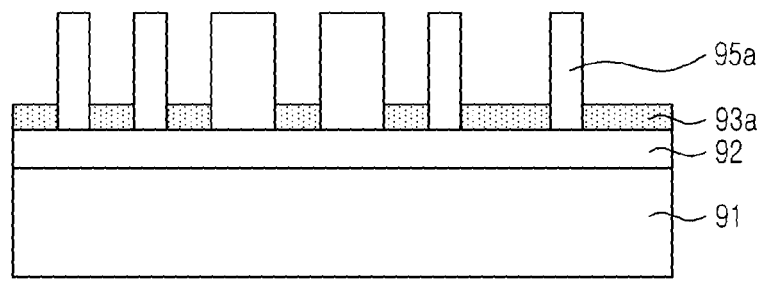

After the polarization process, the mask 93 may be partially removed using the etch stop layer to expose side portions of the planarized nanocores 95a as shown in FIG. 9C. That is, in a process according to an embodiment of the present inventive concept, the second material layer 93b may only be removed and the first material layer 93a may remain.

Figure 9D:
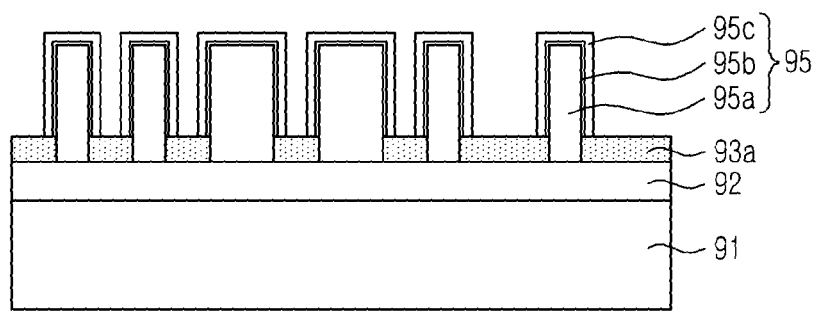

Subsequently, an active layer 95b and a second conductivity type semiconductor layer 95c may be sequentially grown on the surfaces of the plurality of nanocores 95a as shown in FIG. 9D.

Through the above-mentioned process, the nano light emitting structure 95 may have a core-shell structure in which the first conductivity type semiconductor is provided as the nanocores 95a, and the active layer 95b and the second conductivity type semiconductor layer 95c surrounding the nanocore 95a are provided as shell layers.

As such, although an embodiment of the present inventive concept provides the case in which the nano light emitting structure 95 has a rod form in the core-shell structure, the present inventive concept should not be limited thereto. The nano light emitting structure according to embodiments of the present inventive concept may have various different forms such as in a pyramid structure or in a structure in which a pyramid form and a rod form are combined.

As set forth above, according to embodiments of the present inventive concept, a nanostructure having a relatively high aspect ratio may be stably grown by allowing a mask to serve as a mold, whereby a light emitting area may be increased.

In addition, even when a growth height of a nanostructure is different due to uneven deposition according to regions in a crystal growth process, since a planarizing process may be easily applied, a uniform height in a final nanostructure may be secured. In particular, such a process may be usefully used in differentiating cross sections of nanostructures and an interval therebetween in order to implement multiple wavelengths of light, for example, white light.

While the present inventive concept has been shown and described in connection with embodiments, it will be apparent to those skilled in the art that modifications and variations can be made without departing from the spirit and scope of the present inventive concept as defined by the appended claims.

What is claimed is:

1. A method of manufacturing a core-shell structure semiconductor light emitting device, the method comprising:
   providing a base layer formed of a first conductivity type semiconductor;
   forming a mask comprising at least two material layers including an etch stop layer, on the base layer;
   forming, in the mask, a plurality of openings so as to expose regions of the base layer;
   forming a plurality of cores by growing the first conductivity type semiconductor on the exposed regions of the base layer to fill the plurality of openings;
   partially removing the mask by using the etch stop layer to expose side portions of the plurality of cores; and
   sequentially growing a shell including an active layer and a second conductivity type semiconductor layer on surfaces of each of the plurality of cores.

2. The method of claim 1, wherein the mask includes a first material layer formed on the base layer and provided as the etch stop layer, and a second material layer formed on the first material layer and having an etching rate lower than that of the first material layer.

3. The method of claim 1, wherein the mask includes first to third material layers sequentially formed on the base layer, and the second material layer is formed of a material different from the first and third material layers and is provided as the etch stop layer.

4. The method of claim 3, wherein the first and third material layers are formed of an identical material.

5. The method of claim 1, wherein an etch stop level through the etch stop layer is positioned at a depth equal to or below about ⅓ of an overall height of the mask, from an upper surface of the base layer.

6. The method of claim 1, wherein an aspect ratio of at least one of the plurality of the openings is about 5:1 or higher.

7. The method of claim 1, further comprising forming a diffusion preventing film formed of a material different from a material of the mask on respective inner side walls of the plurality of openings, after the forming of the plurality of openings and before the forming of the plurality of nanocores.

8. The method of claim 7, wherein the forming of the diffusion preventing film includes: forming a material film for the diffusion preventing film on the surface of the mask, and removing portions of the material film positioned on an upper surface of the mask and the exposed regions of the base layer such that the material film only remains on an inner side wall of the openings.

9. The method of claim 7, further comprising removing the diffusion preventing film from the exposed side portions of the plurality of cores, before the sequential growth of the active layer and the second conductivity type semiconductor layer.

10. The method of claim 9, wherein after the removing of the diffusion preventing film, a portion of the diffusion preventing film positioned below an upper surface level of the etch stop layer remains.

11. The method of claim 1, further comprising heat treating the plurality of cores between the partial removing of the mask and the sequential growth of the active layer and the second conductive semiconductor layer.

12. The method of claim 11, wherein the heat treating of the plurality of cores is performed at a temperature ranging from about 800 to about 1200 degree C.

13. The method of claim 1, further comprising applying a planarizing process to upper surfaces of the plurality of cores to be planarized to have an identical level.

14. The method of claim 13, wherein at least one group of cores among the plurality of cores have at least one of a cross section and an interval therebetween different from at least one of a cross section of and an interval between another group of cores among the plurality of cores.

* * * * *